(12) United States Patent
Gang

(10) Patent No.: US 10,580,802 B2
(45) Date of Patent: Mar. 3, 2020

(54) DISPLAY DEVICE AND METHOD OF MANUFACTURING THE SAME

(71) Applicant: LG Display Co., Ltd., Seoul (KR)

(72) Inventor: Seola Gang, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 30 days.

(21) Appl. No.: 15/997,956

(22) Filed: Jun. 5, 2018

(65) Prior Publication Data

US 2019/0189636 A1    Jun. 20, 2019

(30) Foreign Application Priority Data

Dec. 19, 2017 (KR) .......................... 10-2017-0174980

(51) Int. Cl.
| | | |
|---|---|---|
| *G02F 1/1333* | (2006.01) | |
| *H01L 27/12* | (2006.01) | |
| *G02F 1/1368* | (2006.01) | |
| *G02F 1/1362* | (2006.01) | |
| *G09G 3/36* | (2006.01) | |
| *G02F 1/1335* | (2006.01) | |
| *G02F 1/1343* | (2006.01) | |

(52) U.S. Cl.
CPC .......... *H01L 27/124* (2013.01); *G02F 1/1333* (2013.01); *G02F 1/1368* (2013.01); *G02F 1/133308* (2013.01); *G02F 1/133602* (2013.01); *G02F 1/134309* (2013.01); *G02F 1/136286* (2013.01); *G09G 3/3688* (2013.01); *G02F 1/133345* (2013.01); *G02F 2001/133357* (2013.01); *G02F 2001/133388* (2013.01); *G02F 2201/121* (2013.01); *G02F 2201/123* (2013.01)

(58) Field of Classification Search
CPC ............. G02F 1/1333; G02F 1/133345; G02F 1/133357; G02F 1/36286; G02F 1/33388; H01L 27/124
See application file for complete search history.

(56) References Cited

U.S. PATENT DOCUMENTS

| | | | | |
|---|---|---|---|---|
| 10,038,015 | B2 * | 7/2018 | Wu | .................. H01L 27/127 |
| 2013/0038549 | A1 * | 2/2013 | Kitada | ................... G06F 3/0338 |
| | | | | 345/173 |
| 2015/0243686 | A1 * | 8/2015 | Lee | ...................... G02F 1/13624 |
| | | | | 257/43 |
| 2017/0176797 | A1 * | 6/2017 | Kim | ..................... G02F 1/13338 |
| 2017/0357120 | A1 * | 12/2017 | Kim | .................. G02F 1/133512 |
| 2019/0137808 | A1 * | 5/2019 | Koide | .................... H01L 23/544 |

FOREIGN PATENT DOCUMENTS

| | | |
|---|---|---|
| KR | 10-0504534 B1 | 8/2005 |
| KR | 10-2017-0064065 A | 6/2017 |

* cited by examiner

*Primary Examiner* — Ricardo Osorio
(74) *Attorney, Agent, or Firm* — Morgan, Lewis & Bockius LLP

(57) ABSTRACT

A display device includes a substrate defining a display area having a plurality of pixels therein and a non-display area; a gate electrode in the display area; a panel identification layer in a panel identification area of the non-display area; a gate insulation layer on the gate electrode; a first passivation layer on the gate insulation layer; a planarization layer on the first passivation layer; and a second passivation layer on the planarization layer, wherein the second passivation layer and the planarization layer are absent in a portion of the panel identification area such that a portion of the first passivation layer is not covered by the second passivation layer and the planarization layer.

19 Claims, 17 Drawing Sheets

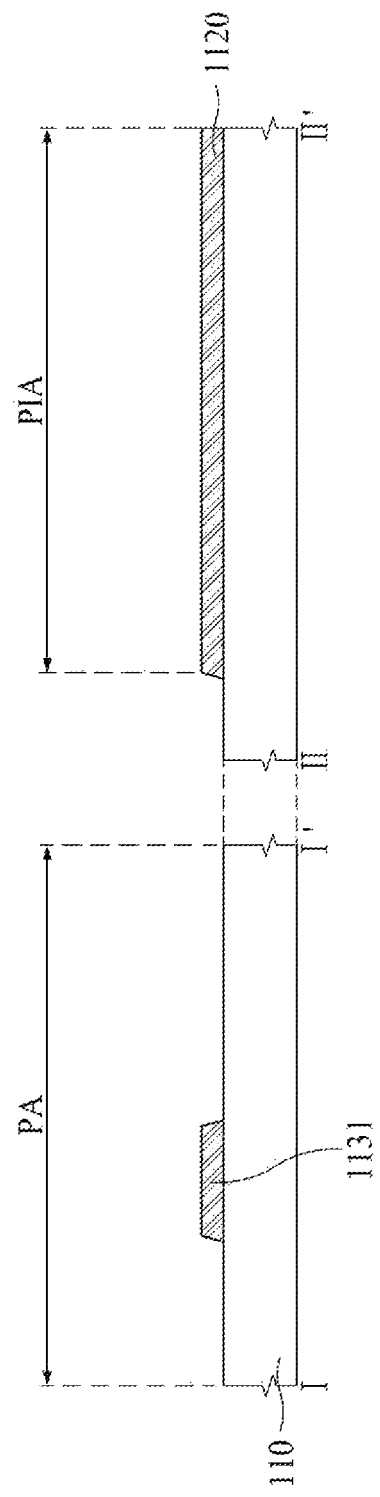

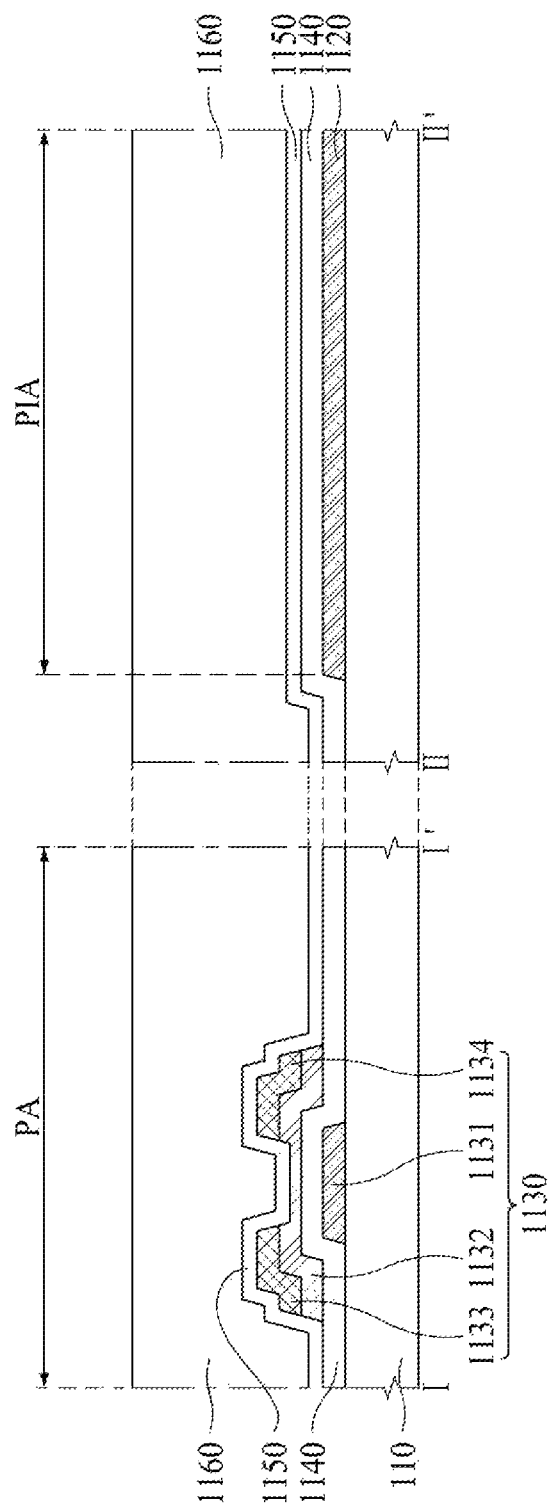

DISPLAY DEVICE AND METHOD OF MANUFACTURING THE SAME

This application claims the benefit of the Korean Patent Application No. 10-2017-0174980 filed on Dec. 19, 2017, which is hereby incorporated by reference as if fully set forth herein.

BACKGROUND

Technical Field

The present disclosure relates to a display device, and more particularly, to a display device having a panel identification and a method of manufacturing such a display device.

Discussion of the Related Art

With the advancement of an information-oriented society, various requirements for display devices for displaying an image have increased. Various display devices, such as liquid crystal display (LCD) devices and light emitting display devices, are being used practically. Light emitting display devices may be categorized into organic light emitting display devices, which use an organic light emitting diodes (OLEDs) as light emitting elements, and light emitting diode display devices, which use micro light emitting diodes as light emitting elements.

A display device includes a display panel having a plurality of data lines, a plurality of scan lines, and a plurality of pixels connected to the data lines and the scan lines. A display device also includes a scan driver that supplies scan signals to the scan lines, and a data driver that supplies data voltages to the data lines.

To facilitate tracing of a process history of a display panel, a unique panel identification (hereinafter referred to as a panel ID) may be provided in the display panel. The panel ID of the display panel is recognized using an optical character reader (OCR) after a scribing process and a lighting test process end and before a module process starts, for management of the process history.

However, when the panel ID is recognized using the OCR, a panel ID recognition error can occur, and when the panel ID recognition error occurs, process delay can occur for re-recognizing the panel ID. Also, when the panel ID is abnormally recognized, an error can occur in tracing the process history, or it can be unable to trace the process history. To increase a panel ID recognition rate using the OCR, the panel ID may be implemented by increasing an intensity of a laser, but in this case, a passivation layer can be stripped from a gate insulation layer.

SUMMARY

Accordingly, embodiments of the present disclosure are directed to a display device and a method of manufacturing the display device that substantially obviate one or more problems due to limitations and disadvantages of the related art.

An object of embodiments of the present invention is to provide a display device and a method of manufacturing the display device that reduces a recognition errors occurring when recognizing a panel ID using an OCR.

In addition to the aforesaid objects of the present disclosure, other features and advantages of the present disclosure will be described below, but will be clearly understood by those skilled in the art from descriptions below.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a substrate defining a display area having a plurality of pixels therein and a non-display area; a gate electrode in the display area; a panel identification layer in a panel identification area of the non-display area; a gate insulation layer on the gate electrode; a first passivation layer on the gate insulation layer; a planarization layer on the first passivation layer; and a second passivation layer on the planarization layer, wherein the second passivation layer and the planarization layer are absent in a portion of the panel identification area such that a portion of the first passivation layer is not covered by the second passivation layer and the planarization layer.

In another aspect, a method of manufacturing a display device comprises forming a gate electrode on a substrate in a display area including a plurality of pixels, and a panel identification layer on the substrate in a panel identification area of a non-display area; forming a gate insulation layer on the gate electrode; forming a first passivation layer on the gate insulation layer; forming a planarization layer on the first passivation layer and removing the planarization layer in the panel identification area; forming a pixel electrode on the planarization layer in the display area and forming an etch stop layer on the first passivation layer and the planarization layer in the panel identification area; forming a second passivation layer on the pixel electrode and the etch stop layer; removing a portion of the second passivation layer at a portion of the panel identification area; and forming a common electrode on the second passivation layer and removing the etch stop layer.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings:

FIGS. 10A to 10I are cross-sectional views for describing a method of manufacturing a display device according to an embodiment of the present disclosure.

DETAILED DESCRIPTION

Figure 1:
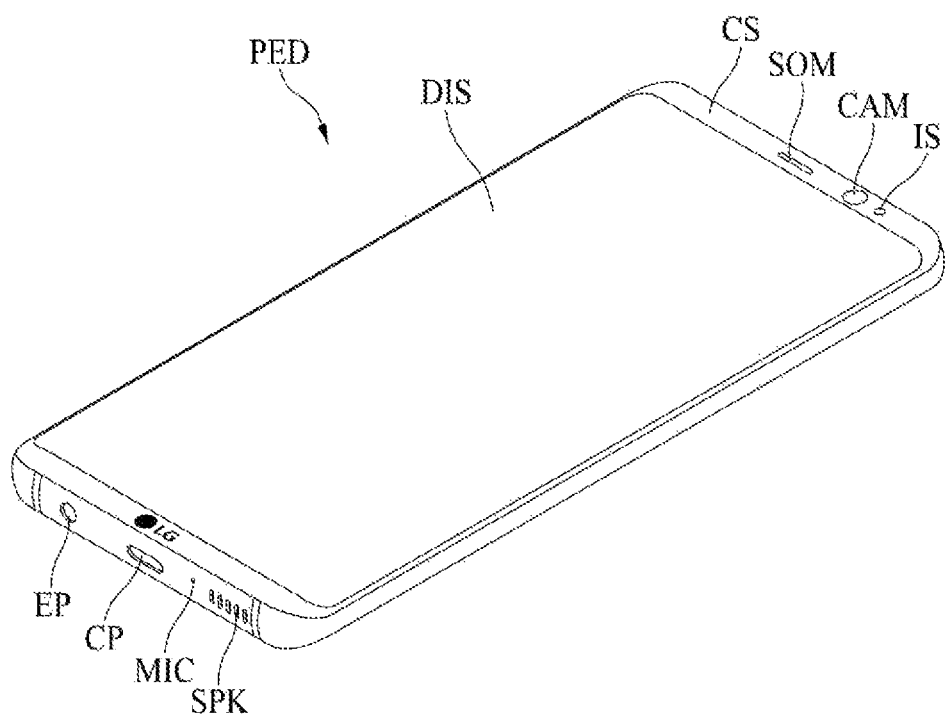
FIG. 1 is a perspective view illustrating a portable electronic device including a display device according to an embodiment of the present disclosure.

Reference will now be made in detail to embodiments of the present disclosure, examples of which are illustrated in the accompanying drawings. Wherever possible, the same reference numbers will be used throughout the drawings to refer to the same or like parts.

In the specification, like reference numerals refer to like elements. In the following description, when the detailed description of the relevant known function or configuration is determined to unnecessarily obscure the important point of the present disclosure, the detailed description will be omitted. Names for each element used herein is selected in consideration of ease of description of the specification and may differ from a name of an actual product.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

FIG. 1 is a perspective view illustrating a portable electronic device PED including a display device according to an embodiment of the present disclosure.

With reference to FIG. 1, the portable electronic device PED according to an embodiment of the present disclosure may be described as a smartphone, but is not limited thereto.

That is, the portable electronic device PED according to an embodiment of the present disclosure may be a tablet or notebook computer. Also, a display device DIS according to an embodiment of the present disclosure may be applied to various electronic devices such as monitors and televisions (TVs), in addition to the portable electronic device PED.

The portable electronic device PED may include a case CS forming an external appearance, the display device DIS, a sound output module SOM, an image sensor (or a camera) CAM, an illumination sensor IS, a speaker SPK, a microphone MIC, an earphone port EP, and a charging port CP.

The case CS may be provided to cover a front surface, a side surface, and a rear surface of the portable electronic device PED. The case CS may be formed of plastic. The display device DIS, the sound output module SOM, the camera CAM, and the illumination sensor IS may be disposed on the front surface of the case CS. The microphone MIC, the earphone port EP, and the charging port CP may be disposed on one side surface of the case CS.

The display device DIS may occupy most of the front surface of the portable electronic device PED. The display device DIS will be described in detail with reference to FIG. 2.

The sound output module SOM may be a reception device that outputs a sound of the other party when talking over a telephone. The image sensor CAM may be a device for capturing an image seen in front of the portable electronic device, and another image sensor may be additionally disposed on the rear surface of the portable electronic device PED. The illumination sensor IS may be a device that senses the amount of incident light to control illuminance of the display device DIS. The microphone MIC may be a transmission device that converts a sound wave of a voice of a user into an electrical signal when talking with the other party, and transmits the electrical signal. The speaker SPK may output a sound signal associated with an application or a function executed in the portable electronic device PED. The earphone port EP may be a port that, when an earphone is inserted into the port, outputs a sound signal to the earphone, instead of the speaker SPK. The charging port CP may be a port to which a charger for charging a battery of the portable electronic device PED is connected.

Figure 2:
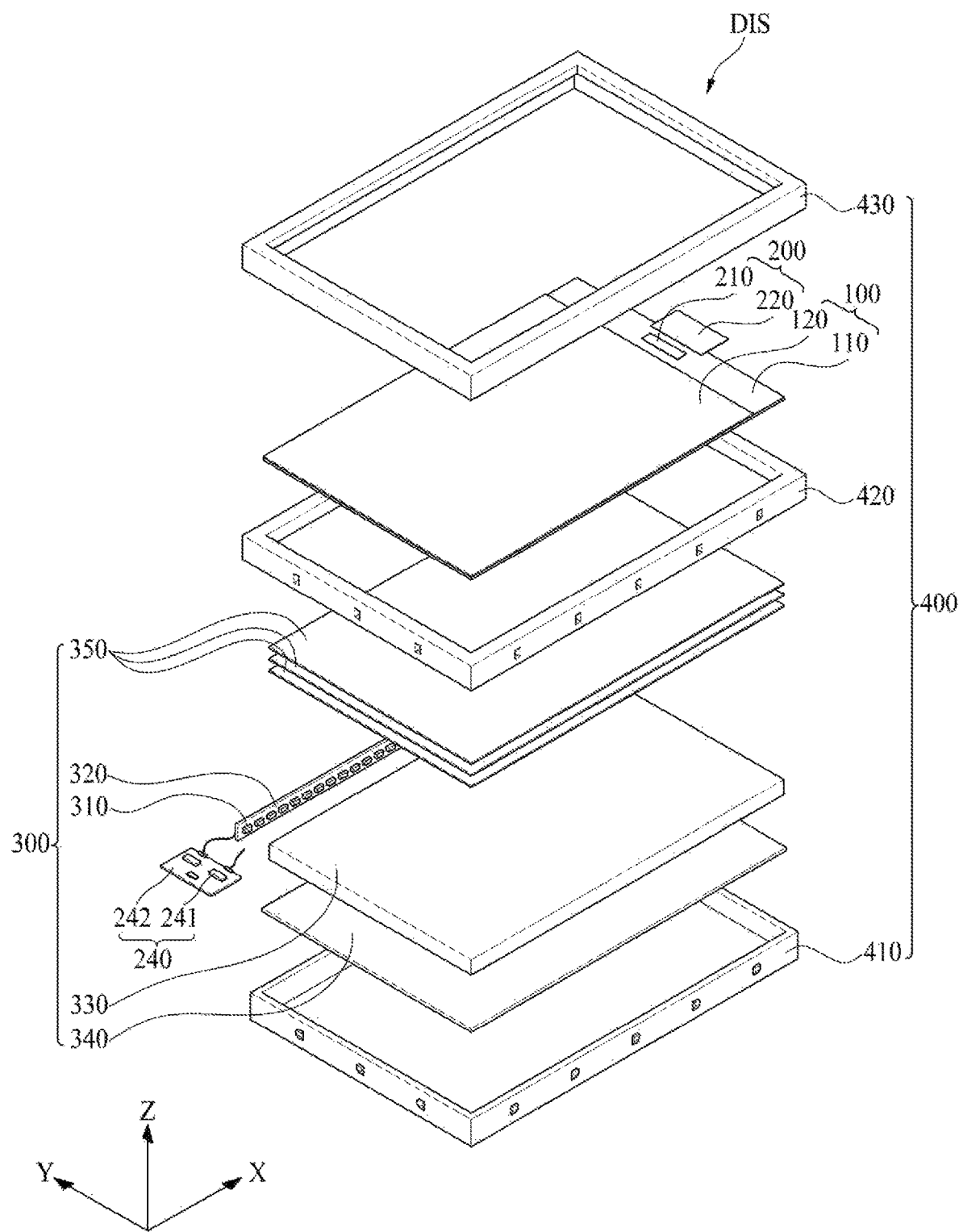
FIG. 2 is an exploded perspective view illustrating a display device according to an embodiment of the present disclosure.

FIG. 2 is an exploded perspective view illustrating a display device according to an embodiment of the present disclosure.

In FIG. 2, the display device is described as an LCD device, but embodiments of the present disclosure are not limited thereto. The display device according to an embodiment of the present disclosure may be implemented as an organic light emitting display device which uses an OLED as a light emitting element, or may be implemented as a light emitting diode display device which uses a micro light emitting diode as a light emitting element. The display device DIS disclosure may include a display panel 100, a driving circuit unit 200 for driving the display panel 100, a backlight unit 300, and a case member 400.

The display panel 100 may include a lower substrate 110, an upper substrate 120, and a liquid crystal layer disposed between the lower substrate 110 and the upper substrate 120. The lower substrate 110 and the upper substrate 120 may each be formed of glass, plastic, and/or the like.

A size of the lower substrate 110 may be greater than that of the upper substrate 120. Therefore, an integration driving circuit 210 may be attached on one edge, uncovered by the upper substrate 120, of a top of the lower substrate 110 in a chip on glass (COG) type or a chip on plastic (COP) type, and a flexible circuit board 220 may be attached on the one edge. The top of the lower substrate 110 may correspond to a surface facing the upper substrate 120.

A plurality of signal lines and a plurality of pixels may be provided on the top of the lower substrate 110 of the display panel 100. The signal lines may include a plurality of data lines and a plurality of gate lines which intersect one another, a common line for supplying a common voltage to a plurality of common electrodes, and a plurality of gate control signal lines through which a control signal is supplied to a gate driving circuit. The lower substrate 110 will be described below in detail with reference to FIG. 3.

A black matrix and a color filter may be provided on a bottom of the upper substrate 120 of the display panel 100. The bottom of the upper substrate 120 may correspond to a surface facing the lower substrate 110. However, when the display panel 100 is configured as a color filter on thin film transistor (TFT) array (COT) type, the black matrix and the color filter may be provided on the top of the lower substrate 110. In a vertical electric field mode, such as a twisted nematic (TN) mode or a vertical alignment (VA) mode, a common electrode may be provided on the bottom of the upper substrate 120. In an in-plane switching driving mode, such as an in-plane switching (IPS) mode or a fringe field switching (FFS) mode, the common electrode may be provided on the top of the lower substrate 110. Also, an alignment layer for adjusting a pre-tilting angle of a liquid crystal may be provided on the top of the lower substrate 110 and the bottom of the upper substrate 120 in the display panel 100.

A lower polarizer may be attached on the bottom of the lower substrate 110 of the display panel 100. A transparent electrode may be provided on the whole top of the upper substrate 120 of the display panel 100, and an upper polarizer may be attached on the transparent electrode. The transparent electrode may be connected to a ground to discharge static electricity applied to the upper substrate 120 of the display panel 100.

The driving circuit unit 200 may include the integration driving circuit 210, the flexible circuit board 220, a gate driving circuit (230 of FIG. 3), and a light source driver 240.

The integration driving circuit 210 may be a driving circuit into which a data driving circuit, a timing control circuit, a power supply circuit, and a gamma voltage circuit are integrated. The data driving circuit may be a circuit that generates data voltages from gamma voltages generated by the gamma voltage circuit and supplies the data voltages to the data lines of the display panel 110, and the timing control circuit may be a circuit that controls an operation timing of the data driving circuit and an operation timing of a gate driving circuit provided in the display panel 110. Also, the power supply circuit may be a circuit that generates and supplies driving voltages necessary for the data driving circuit, the timing control circuit, the gamma voltage circuit, and the gate driving circuit. Also, the gamma voltage circuit may be a circuit that supplies the gamma voltages to the data driving circuit.

The integration driving circuit 210 may be implemented as a chip type, such as an integrated circuit (IC), and may be directly attached on the top of the lower substrate 110 in a COG type or a COP type. In this case, the integration driving circuit 210 and the flexible circuit board 220 may be attached on one edge, uncovered by the upper substrate 120, of the top of the lower substrate 110. Alternatively, the integration driving circuit 210 may be attached on a source flexible film in a chip on film (COF) type. The source flexible film may be provided in plurality, and the plurality of source flexible films may be attached on one edge, uncovered by the upper substrate 120, of the top of the lower substrate 110.

Figure 3:
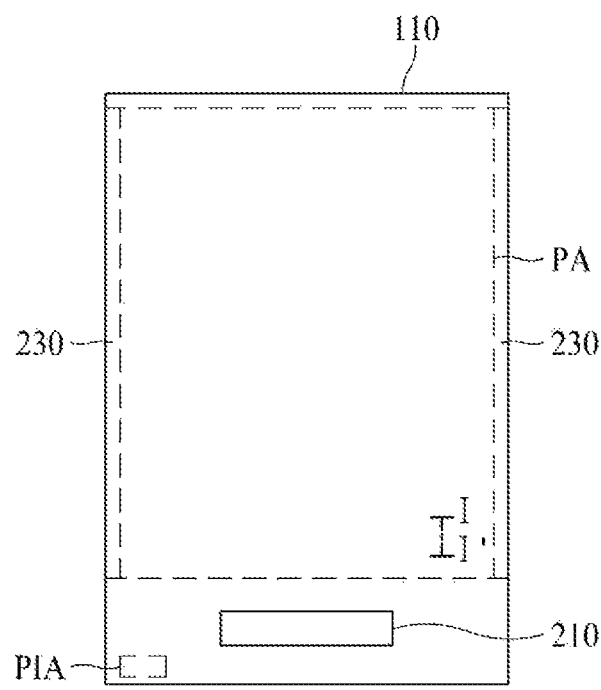
FIG. 3 is a plan view illustrating a lower substrate of a display panel of FIG. 2.

The gate driving circuit 230 may supply gate signals to the gate lines of the lower substrate 110 as in FIG. 3. The gate driving circuit 230 will be described below in detail with reference to FIG. 3.

The light source driver 240 may include a light source driving circuit 241 and a light source circuit board 242. The light source driving circuit 240 may supply a driving current to a plurality of light sources 310, for the light sources 310 to emit light. The light source driving circuit 240 may be mounted on the light source circuit board 242.

The backlight unit 300 may include the light sources 310, a light source circuit board 320, a light guide plate 330, a reflective sheet 340, and a plurality of optical sheets 350. The backlight unit 300 may convert light, emitted from each of the light sources 310, into uniform flat light using the light guide plate 330 and the optical sheets 350 and may irradiate the flat light onto the display panel 100. In FIG. 2, the backlight unit 330 is illustrated as an edge type backlight unit, but embodiments of the present disclosure are not limited thereto. In other embodiments, the backlight unit 330 may be a direct type backlight unit.

The light sources 310 may each be implemented with a light emitting diode (LED). The light sources 310 may be disposed on at least one side surface of the light guide plate 330 and may irradiate lights onto a side surface of the light guide plate 330. The light sources 310 may be mounted on the light source circuit board 320 and may be turned on/off by the driving current supplied from the light source driving circuit 241. The light source circuit board 320 may be connected to the light source driver 240.

The light guide plate 330 may convert the light, emitted from each of the light sources 310, into the flat light and may irradiate the flat light onto the display panel 100. The reflective sheet 340 may be disposed on a bottom of the light guide plate 330 and may reflect light, traveling to a portion under the light guide plate 330, to the light guide plate 330.

The optical sheets 350 may be disposed between the light guide plate 330 and the display panel 100. The optical sheets 350 may include one or more prism sheets and one or more diffusive sheets. The optical sheets 350 may diffuse light incident from the light guide plate 330 and may refract a traveling path of the light so that the light is incident at an angle substantially vertical to a light incident surface of the display panel 100. Also, the optical sheets 350 may include a dual brightness enhancement film.

The case member 400 may include a bottom cover 410, a support frame 420, and a top case 430. The bottom cover 410 may be formed of metal to have the form of a tetragonal frame and may surround a side surface and a bottom of the backlight unit 300 as in FIG. 3. The bottom cover 410 may be formed of advanced high strength steel (AHSS), and for example, may be formed of electrolytic galvanized iron (EGI), stainless use steel (SUS), super galvalume steel coil (SGLC), aluminum-coated steel sheet (ALCOSTA), tin-plated steel sheet (SPTE), and/or the like.

The support frame 420 may support the bottom of the lower substrate 110 of the display panel 100. The support frame 420 may be coupled and fixed to the bottom cover 410 by a fixing member. The support frame 420 may be formed of plastic, where synthetic resin such as polycarbonate is mixed with glass fiber, to have the form of a tetragonal frame, or may be formed of SUS.

The top case 430 may surround an edge of the display panel 100, a top and a side surface of the support frame 420, and a side surface of the bottom cover 410. The top case 430 may be formed of EGI, SUS, and/or the like. The top case 430 may be fixed to the support frame 420 by a hook or a screw.

FIG. 3 is a plan view illustrating the lower substrate of the display panel of FIG. 2.

As shown in FIG. 3, a display area PA where the plurality of pixels is provided to display an image, the gate driving circuit 230, and a panel identification area PIA (hereinafter referred as a panel ID area) may be provided on the top of the lower substrate 110 of the display panel 100. Also, the integration driving circuit 210 may be attached on the top of the lower substrate 110 of the display panel 100.

The display area PA may be an area that displays an image using the pixels. The data lines, the gate lines intersecting the data lines, and the pixels respectively provided in a plurality of areas defined by intersections of the data lines and the gate lines may be provided in the display area PA. Each of the pixels may include a TFT, a pixel electrode, and the common electrode. The TFT may supply, to the pixel electrode, a data voltage of a data line connected thereto in response to a gate signal of a gate line connected thereto. The liquid crystal of the liquid crystal layer may be driven by an electric field generated from a potential difference between the data voltage supplied to the pixel electrode and a common voltage supplied to the common electrode, thereby controlling a transmittance of light incident from the backlight unit 300.

The gate driving circuit 230 may supply gate signals to the gate lines. The gate driving circuit 230 may be directly provided on the top of the lower substrate 110 in a gate driver in panel (GIP) type. In this case, the gate driving circuit 230 may be provided in a non-display area except for the display area PA. In FIG. 3, an example where the gate driving circuit 230 is disposed outside each of both sides of the display area PA is illustrated, but embodiments of the present disclosure are not limited thereto. In other embodiments, the gate driving circuit 230 may be disposed outside one side of the display area PA. Alternatively, the gate driving circuit 230 may be implemented as a chip type such as an IC and may be attached on a gate flexible film in a COF type. The gate flexible film may be provided in plurality, and the plurality of gate flexible films may be attached on an edge, uncovered by the upper substrate 120, of the top of the lower substrate 110.

The integration driving circuit 210 may be implemented as a chip type, such as an IC as described above with reference to FIG. 2, and may be directly attached on the top of the lower substrate 110 in a COG type or a COP type. The integration driving circuit 210 may be connected to various signal lines, such as data link lines, the gate control signal lines, and common voltage supply lines, which are provided in the non-display area on the top of the lower substrate 110. The data link lines may connect the integration driving circuit 210 to the data lines provided in the display area PA, and the gate control signal lines may connect the integration driving circuit 210 to the gate driving circuit 230. Also, the common voltage supply lines may connect the integration driving circuit 210 to the common lines provided in the display area PA.

The panel ID area PIA may be provided in the non-display area except for the display area PA as in FIG. 2. In FIG. 3, an example is illustrated where the panel ID area PIA is disposed in a first edge of the lower substrate 110 with the integration driving circuit 210 attached thereon, but embodiments of the present disclosure are not limited thereto. In other embodiments, the panel ID area PIA may be disposed in a second edge opposite to the first edge of the lower substrate 110. Alternatively, the panel ID area PIA may be disposed in a third edge or a fourth edge of the lower substrate 110 with the gate driving circuit 230 provided thereon.

A panel ID may be patterned on a panel identification layer (hereinafter referred to as a panel ID layer) provided on the lower substrate 110 by using a laser, and thus, the panel ID area PIA may not overlap the signal lines provided in the non-display area. Accordingly, under a condition where the panel ID area PIA does not overlap the signal lines provided in the non-display area, the panel ID area PIA may be provided in an arbitrary portion of the non-display area on the top of the lower substrate 110.

Figure 4:
FIG. 4 is an enlarged plan view illustrating in detail a lower substrate on which a panel identification area of FIG. 3 is provided.

FIG. 4 is an enlarged plan view illustrating in detail the lower substrate on which the panel ID area of FIG. 3 is provided.

As shown in FIG. 4, the panel ID area PIA may include a panel ID layer PIL and a panel ID PID. The panel ID layer PIL may be provided in all of the panel ID area PIA as illustrated in FIG. 4. The panel ID area PIA may be defined as an area where the panel ID layer PIL is provided. The panel ID layer PIL may be formed as a metal layer, thereby enabling the panel ID PID to be patterned. For example, the panel ID layer PIL may be formed as a metal layer that is the same as a gate electrode, as in FIG. 5.

The panel ID PID may correspond to a unique panel identification means having a value that is set differently in each of a plurality of display panels 110. The panel ID PID may include one or more of a letter, a number, and a sign, or a combination thereof as in FIG. 4. In FIG. 4, an example where the panel ID PID includes a combination of letters and numbers is illustrated.

The panel ID PID may be pattern-formed on the panel ID layer PIL. In detail, the panel ID PID may be provided on the panel ID layer PIL to have an engraved pattern by using a laser. The panel ID PID may be engraved in comparison with the panel ID layer PIL. Therefore, when the panel ID PID is recognized using an OCR, the panel ID PID may be optically distinguished from the panel ID layer PIL. Accordingly, the panel ID PID may be recognized by the OCR.

Figure 5:
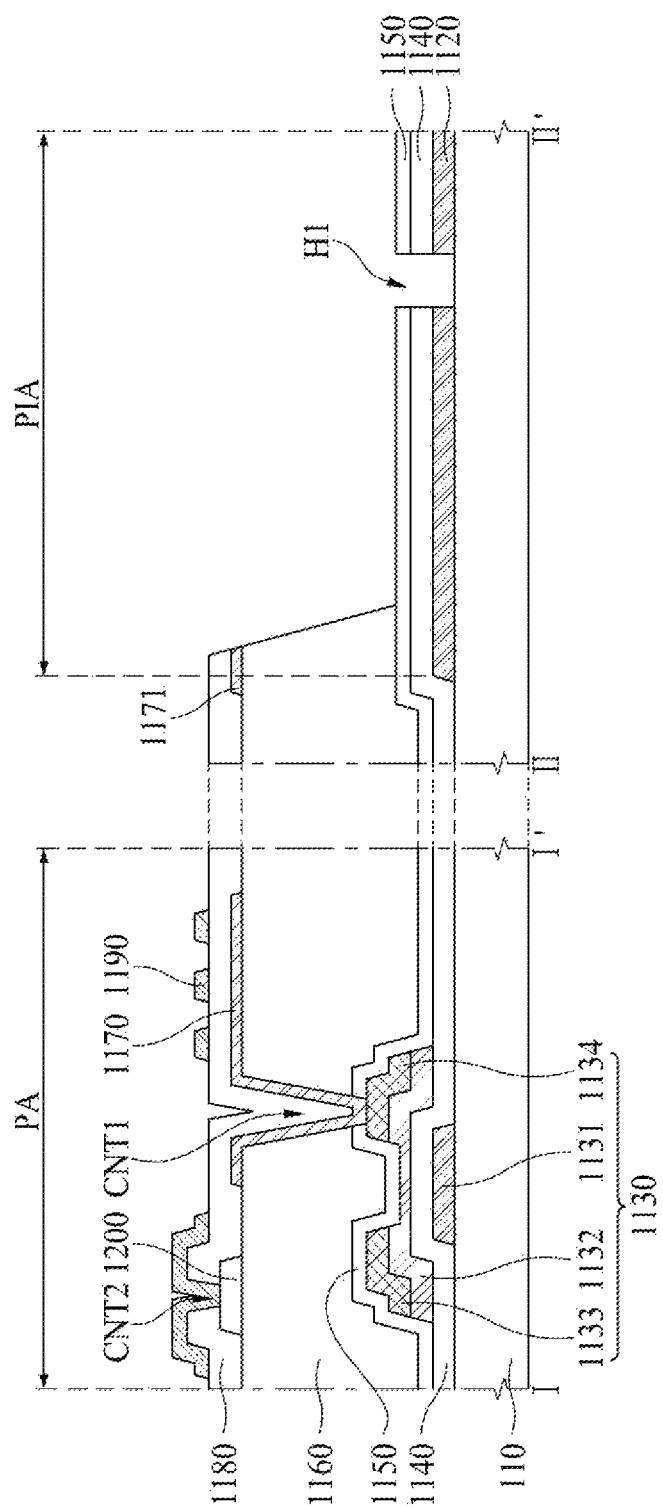
FIG. 5 is a cross-sectional view illustrating an example of line I-I' of FIG. 3 and line II-II' of FIG. 4.

FIG. 5 is a cross-sectional view illustrating an example of line I-I' of FIG. 3 and line II-II' of FIG. 4. A cross-sectional view taken along line I-I' in FIG. 5 is a cross-sectional view illustrating a portion of a pixel in the display area PA, and a cross-sectional view taken along line II-II' is a cross-sectional view illustrating a portion of the panel ID area PIA.

With reference to FIG. 5, the lower substrate 110 may include glass, plastic, and/or the like. The lower substrate 110 may be a TFT array substrate on which a plurality of TFTs 1130 are provided. A plurality of TFTs 1130 may be provided on the lower substrate 110. Each of the TFTs 1130 may include a gate electrode 1131, a semiconductor layer 1132, a source electrode 1133, and a drain electrode 1134. In the example of FIG. 5, each of the TFTs 1130 is illustrated as being provided as a bottom gate type where the gate electrode 1131 is disposed under the semiconductor layer 1132, but embodiments of the present disclosure are not limited thereto. In other embodiments, each of the TFTs 1130 may be provided as a top gate type, where the gate electrode 1131 is disposed on the semiconductor layer 1132, or a double gate type where the gate electrode 1131 is disposed both on and under the semiconductor layer 1132.

Moreover, in FIG. 5, each of the TFTs 1130 is illustrated as being provided in an inverted staggered structure using a back channel etched (BCE) process, but embodiments of the present disclosure are not limited thereto. In other embodiments, each of the TFTs 1130 may be provided in a coplanar structure. The inverted staggered structure may have a bottom gate structure where the gate electrode 1131 is disposed under the semiconductor layer 1132. The coplanar structure may have a top gate structure where the gate electrode 1131 is disposed on the semiconductor layer 1132.

A gate metal layer which includes a gate line, the gate electrode 1131, and a panel ID layer 1120 may be provided on the lower substrate 110. That is, the gate line, the gate electrode 1131, and the panel ID layer 1120 may be formed of the same material on the same layer. Therefore, a separate metal layer may not be formed for forming the panel ID layer 1120, thereby preventing the manufacturing cost from increasing.

The gate line and the gate electrode 1131 may be provided in a display area PA, and the panel ID layer 1120 may be provided in a panel ID area PIA of a non-display area. The gate metal layer may be formed of one of molybdenum (Mo), titanium (Ti), aluminum (Al), copper (Cu), and chromium (Cr), or an alloy thereof.

A gate insulation layer 1140 may be provided on the gate metal layer. For example, the gate insulation layer 1140 may be formed of a single layer including oxide silicon ($SiO_2$) or nitride silicon (SiNx), or may be formed of a complex layer including $SiO_2$ and SiNx.

The semiconductor layer 1132 may be provided on the gate insulation layer 1140. The semiconductor layer 1132 may be provided to overlap the gate electrode 1131. The semiconductor layer 1132 may be formed of a silicon-based semiconductor material or an oxide-based semiconductor material. The silicon-based semiconductor material may use amorphous silicon or polycrystalline silicon, which has better mobility than amorphous silicon, and thus, has low power consumption and good reliability.

The source electrode 1133 connected to one side of the semiconductor layer 1132, the drain electrode 1134 connected to the other side of the semiconductor layer 1132, and a source/drain metal layer including a data line may be provided on the semiconductor layer 1132. The source/drain metal layer may be formed of one of Mo, Ti, Al, Cu, and Cr, or an alloy thereof.

A first passivation layer 1150 may be provided on the semiconductor layer 1132 and the source/drain metal layer. The first passivation layer 1150 may be formed of a single layer including $SiO_2$ or SiNx, or may be formed of a complex layer including $SiO_2$ and SiNx.

A planarization layer 1160 may be provided on the first passivation layer 1150. A first contact hole CNT1, which passes through the first passivation layer 1150 and the planarization layer 1160 to expose the drain electrode 1134, may be provided in the first passivation layer 1150 and the planarization layer 1160. Also, the planarization layer 1160 may be removed from the panel ID area PIA, and thus, the first passivation layer 1150 disposed on the panel ID layer 1120 may be exposed. The planarization layer 1160 may be formed of an organic layer including acryl resin, epoxy resin, phenolic resin, polyamide resin, polyimide resin, and/or the like. For example, the planarization layer 1160 may be formed of photo acryl, which enables a photo process to be performed.

A pixel electrode 1170 and an etch stop layer 1171 may be provided on the planarization layer 1160. The pixel electrode 1170 may contact the drain electrode 1134 through the first contact hole CNT1. The etch stop layer 1171 may be formed on the planarization layer 1160 near the panel ID area PIA and the first passivation layer 1150 in the panel ID area PIA to prevent the first passivation layer 1150 disposed in the panel ID area PIA from being removed and may remain without being completely removed. The etch stop layer 1171 will be described below in detail with reference to FIG. 9. The pixel electrode 1170 and the etch stop layer 1171 may each be formed of a transparent conductive material (TCO), such as indium tin oxide (ITO) or indium zinc oxide (IZO), capable of transmitting light.

Moreover, a common line 1200 may be provided on the planarization layer 1160. The common line 1200 may be provided on the same layer as the pixel electrode 1170 and the etch stop layer 1171. The common line 1200 may be formed of a material which differs from that of each of the pixel electrode 1170 and the etch stop layer 1171, for lowering a resistance. For example, the common line 1200 may be formed of one of Mo, Ti, Al, Cu, and Cr, or an alloy thereof.

The common line 1200 may be a line for supplying a common voltage to a common electrode 1190. Also, in a case where a display device is implemented as an in-cell touch display device, the common line 1200 may transfer a touch driving signal to the common electrode 1190.

A second passivation layer 1180 may be provided on the pixel electrode 1170, the etch stop layer 1171, and the common line 1200. The second passivation layer 1180 may not be provided in the panel ID area PIA. Also, a second contact hole CNT2 which passes through the second passivation layer 1180 to expose the common line 1200 may be provided in the second passivation layer 1180. The second passivation layer 1180 may be formed of a single layer including $SiO_2$ or SiNx, or may be formed of a complex layer including $SiO_2$ and SiNx.

The common electrode 1190 may be provided on the second passivation layer 1180. The common electrode 1190 may contact the common line 1200 through the second contact hole CNT2. Also, when the pixel electrode 1170 is formed as a surface electrode as illustrated in the example of FIG. 5, the common electrode 1190 may be patterned to be spaced apart from adjacent common electrodes by a certain interval, for generating a fringe field. The common electrode 1190 may be formed of a transparent conductive oxide (TCO) such as ITO or IZO, capable of transmitting light.

An alignment layer may be provided on the second passivation layer 1180 and the common electrode 1190. A liquid crystal layer may be provided between an alignment layer of a lower substrate 110 and an alignment layer of an upper substrate 120.

A first hole H1 passing through the first passivation layer 1150 and the gate insulation layer 1140 may be formed in the panel ID area PIA by removing at least a portion of the panel ID layer 1120. The hole H1 may correspond to an engraved pattern that is formed on the panel ID layer 1120 using a laser, for forming a panel ID PID. Because the first hole H1 is formed using a laser, as in the example of FIG. 5, the first hole H1 may pass through the panel ID layer 1120. Also, a portion of a top of the lower substrate 110 corresponding to the first hole H1 may be removed due to the laser.

Moreover, the panel ID layer 1120 may be electrically floated, and in this case, the panel ID layer 1120 may not be connected to all signal lines provided in the non-display area. Alternatively, the panel ID layer 1120 may be connected to one of the signal lines provided in the non-display area, for reducing a line resistance.

As a thickness of an organic/inorganic layer is increased, a recognition error occurrence rate is high in a case of recognizing the panel ID PID using an OCR. However, in an embodiment of the present disclosure, the planarization layer 1160 and the second passivation layer 1180 may be removed from the panel ID area PIA, and thus, the thickness of the organic/inorganic layer is reduced. As a result, in an embodiment of the present disclosure, a recognition error occurring when recognizing the panel ID PID using the OCR is reduced.

Moreover, in an embodiment of the present disclosure, because a recognition error occurring when recognizing the panel ID using the OCR is reduced even without increasing an intensity of a laser, stripping of the first passivation layer 1150 from the gate insulation layer 1140 is reduced.

Moreover, in an embodiment of the present disclosure, the panel ID layer 1120 is protected by the gate insulation layer 1140 and the first passivation layer 1150, and thus, damage or corrosion of the panel ID layer 1120 is reduced.

Figure 6:
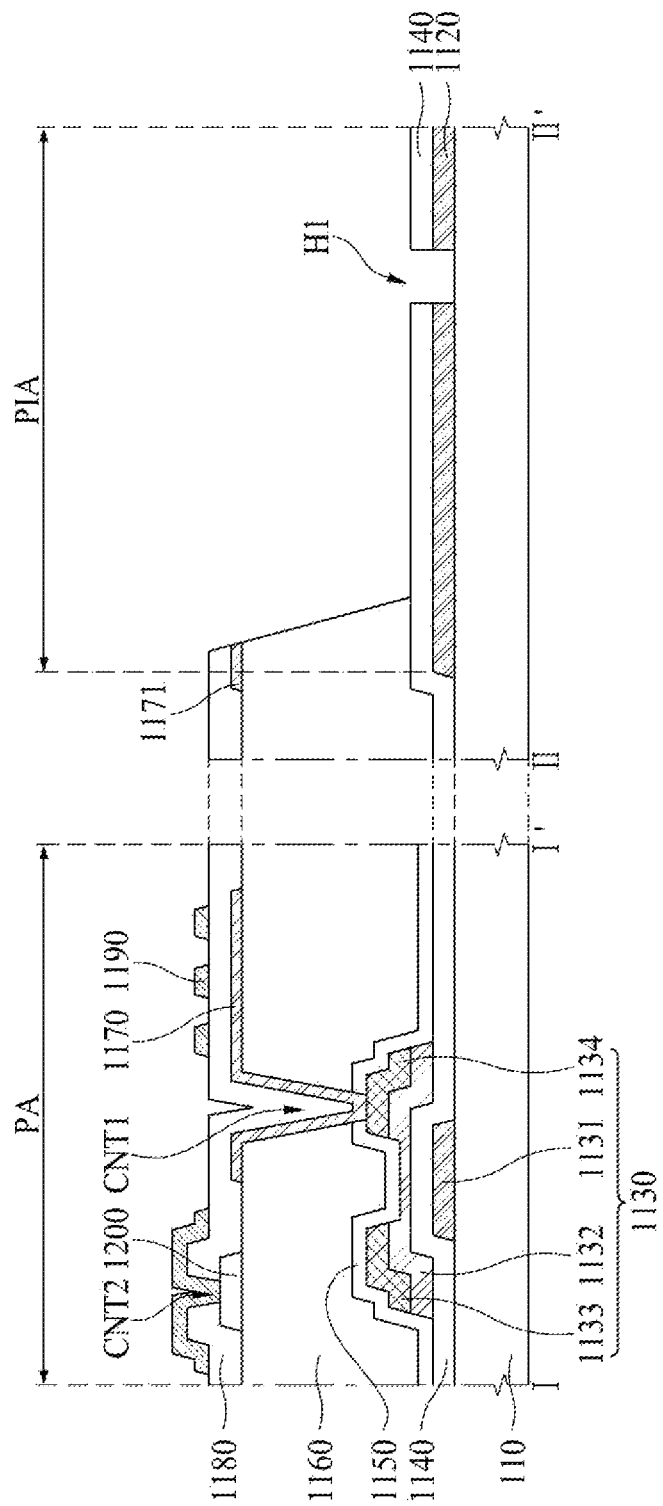
FIG. 6 is a cross-sectional view illustrating another example of line I-I' of FIG. 3 and line II-II' of FIG. 4.

As illustrated in FIG. 5, the planarization layer 1160 and the second passivation layer 1180 may be removed from the panel ID area PIA, but embodiments of the present disclosure are not limited thereto. For example, in embodiments of the present disclosure, as in FIG. 6, the first passivation layer 1150 as well as the planarization layer 1160 and the second passivation layer 1180 may be removed from the panel ID area PIA. Even when the first passivation layer 1150 is removed, the panel ID layer 1120 may be protected by the gate insulation layer 1140, and thus, the panel ID layer 1120 is prevented from damage or corrosion.

Figure 7:
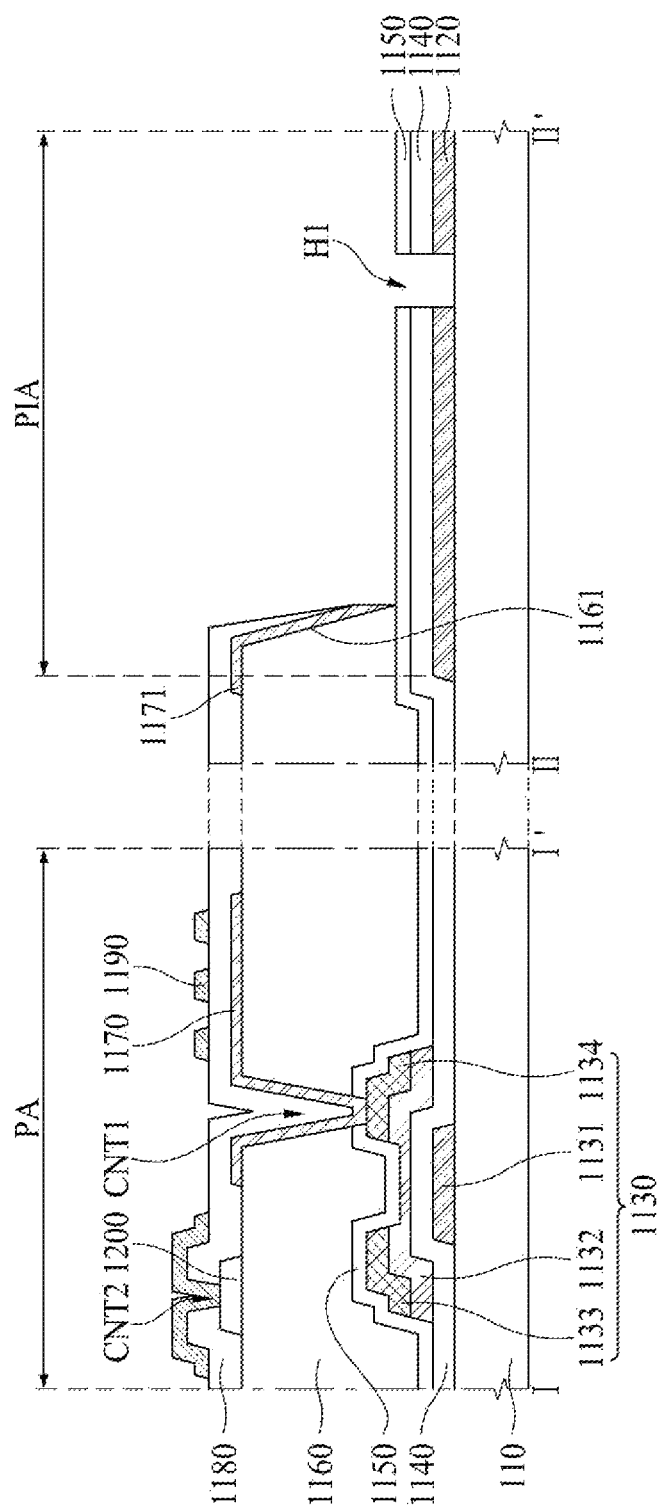
FIG. 7 is a cross-sectional view illustrating another example of line I-I' of FIG. 3 and line II-II' of FIG. 4.

Moreover, in embodiments of the present disclosure, as illustrated in the example of FIG. 7, the second passivation layer 1180 may remain on an inclined surface 1161 of the planarization layer 1160 without being removed in the panel ID area PIA. In this case, the etch stop layer 1171 may remain on the inclined surface 1161 of the planarization layer 1160.

Figure 8:
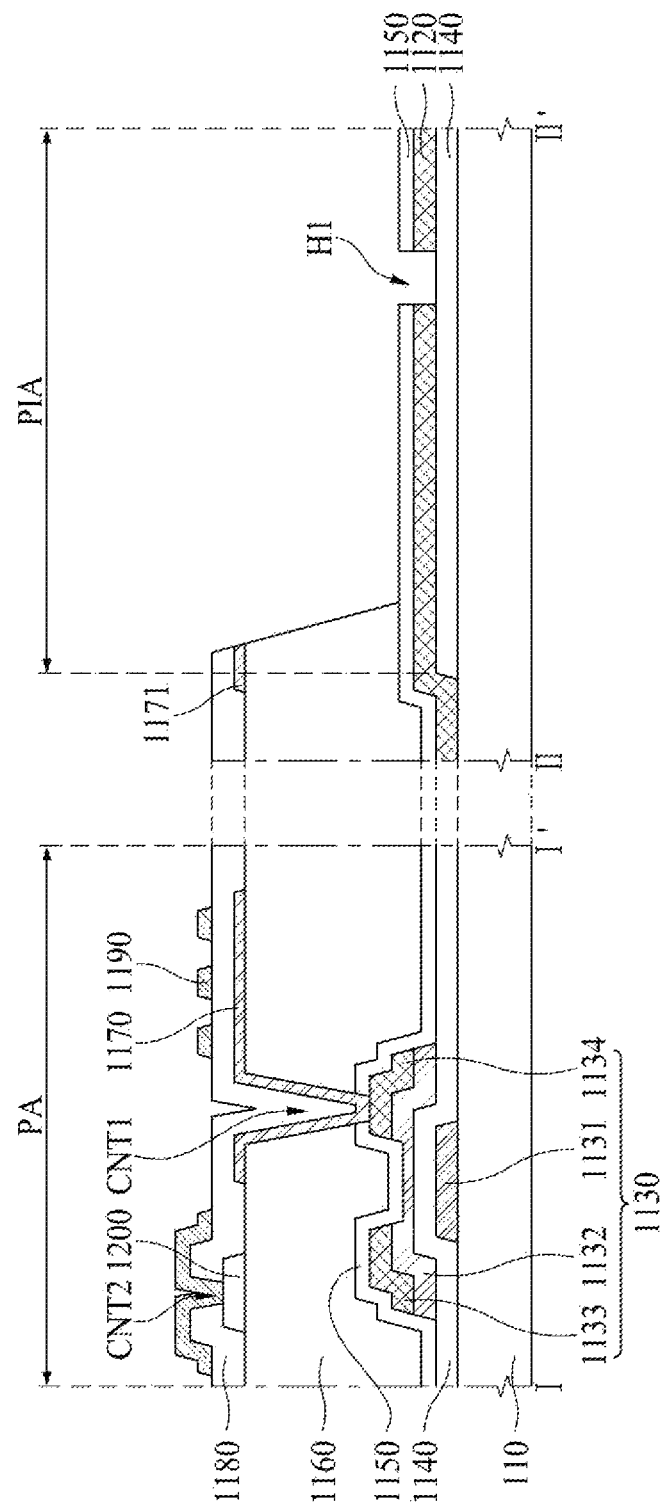
FIG. 8 is a cross-sectional view illustrating another example of line I-I' of FIG. 3 and line II-II' of FIG. 4.

Moreover, in the example of FIG. 5, the panel ID layer 1120, the gate line, and the gate electrode 1131 are provided as the gate metal layer, but embodiments of the present disclosure are not limited thereto. For example, in embodiments of the present disclosure, as in FIG. 8, the panel ID layer 1120, the source electrode 1133, the drain electrode 1134, and the data line may be provided as a source/drain metal layer. Also, the panel ID layer 1120 and the semiconductor layer 1132 may be provided on the gate insulation layer 1140. In this case, as in FIG. 8, at least a portion of the gate insulation layer 1140 may remain in the first hole H1.

Figure 9:
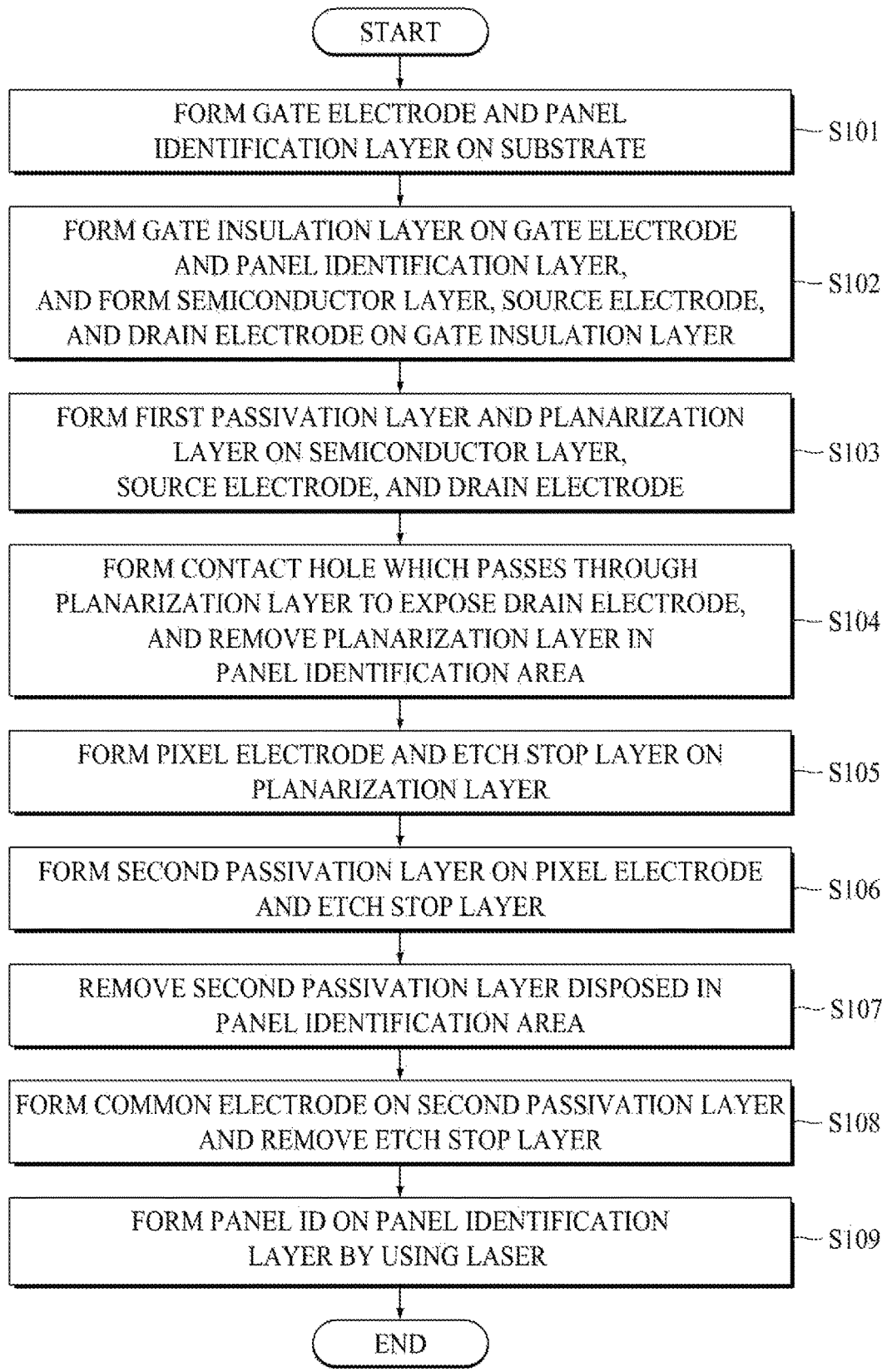
FIG. 9 is a flowchart illustrating a method of manufacturing a display device according to an embodiment of the present disclosure.

FIG. 9 is a flowchart illustrating a method of manufacturing a display device according to an embodiment of the present disclosure. FIGS. 10A to 10I are cross-sectional views for describing a method of manufacturing a display device according to an embodiment of the present disclosure.

First, as shown in FIG. 10A, a gate electrode 1131, a gate line, and a panel ID layer 1120 may be formed on a lower substrate 110. (S101 of FIG. 9.) Here, a first metal layer may be formed on a whole surface of the lower substrate 110 through a sputtering process or a metal organic chemical vapor deposition (MOCVD) process. Subsequently, the gate electrode 1131, the gate line, and the panel ID layer 1120 may be formed by patterning the first metal layer through a mask process using a photoresist pattern. That is, the gate electrode 1131, the gate line, and the panel ID layer 1120 may be formed of the same material on the same layer. The gate line and the gate electrode 1131 may be provided in a display area PA, and the panel ID layer 1120 may be provided in a panel ID area PIA of a non-display area. The gate metal layer may be formed of one of Mo, Ti, Al, Cu, and Cr, or an alloy thereof.

Figure 10B:
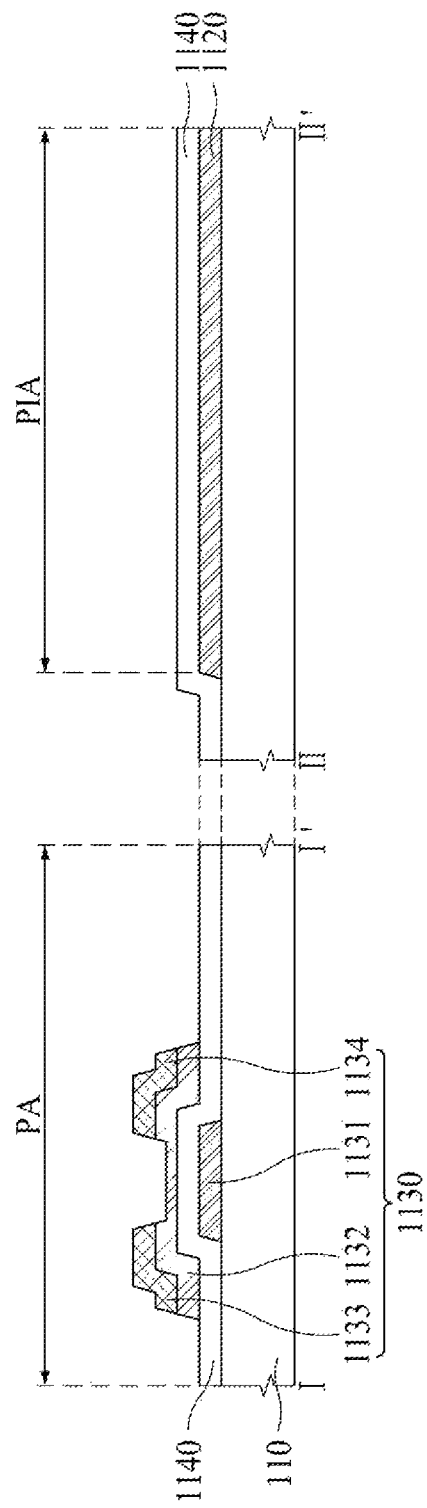

Second, as shown in FIG. 10B, a gate insulation layer 1140 may be formed on the gate electrode 1131, the gate line, and the panel ID layer 1120, and a semiconductor layer 1132, a source electrode 1133, and a drain electrode 1134 may be formed on the gate insulation layer 1140. (S102 of FIG. 9.) Here, the gate insulation layer 1140 may be formed on the gate electrode 1131, the gate line, and the panel ID layer 1120. The gate insulation layer 1140 may be formed of an inorganic layer, and for example, may be formed of SiOx, SiNx, or a multilayer thereof.

Subsequently, a semiconductor metal layer may be formed on a whole upper surface of the gate insulation layer 1140 through a sputtering process or an MOCVD process. Also, a second metal layer may be formed on a whole upper surface of the semiconductor metal layer through a sputtering process or an MOCVD process. Then, the semiconductor layer 1132, the source electrode 1133, the drain electrode 1134, and a data line may be simultaneously formed by patterning the semiconductor metal layer and the second metal layer through a mask process using a photoresist pattern.

The semiconductor layer 1132 may be formed of a silicon-based semiconductor material or an oxide-based semiconductor material. The silicon-based semiconductor material may use amorphous silicon or polycrystalline silicon which has better mobility than amorphous silicon, and thus, has low power consumption and good reliability. The source electrode 1133, the drain electrode 1134, and the data line may be formed of one of Mo, Ti, Al, Cu, and Cr, or an alloy thereof.

Third, as shown in FIG. 10C, a first passivation layer 1150 may be formed on the semiconductor layer 1132, the source electrode 1133, and the drain electrode 1134, and a planarization layer 1160 may be formed on the first passivation layer 1150. (S103 of FIG. 9). The first passivation layer 1150 may be formed of a single layer including $SiO_2$ or SiNx, or may be formed of a complex layer including $SiO_2$ and SiNx. The planarization layer 1160 may be formed of an organic layer including acryl resin, epoxy resin, phenolic resin, polyamide resin, polyimide resin, and/or the like. For example, the planarization layer 1160 may be formed of photo acryl which enables a photo process to be performed.

Figure 10D:
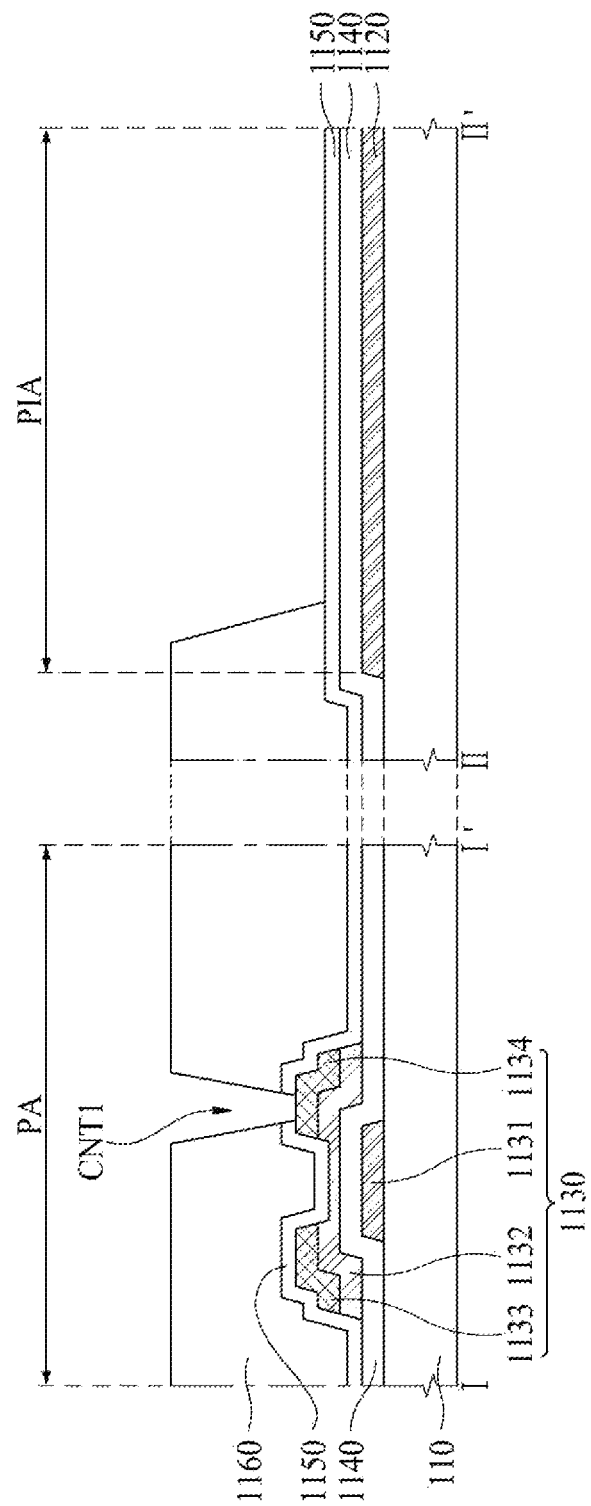

Fourth, as shown in FIG. 10D, a first contact hole CNT1 which passes through the first passivation layer 1150 and the planarization layer 1160 to expose the drain electrode 1134 may be provided in the display area PA, and the first passivation layer 1150 may be exposed by removing the planarization layer 1160 in the panel ID area PIA. (S104 of FIG. 9.) Here, a mask may be disposed on the planarization layer 1160, and then, the planarization layer 1160 disposed on the drain electrode 1134 in the display area PA and the planarization layer 1160 disposed in the panel ID area PIA may be removed through an exposure process and a development process.

Subsequently, the first contact hole CNT1 may be formed by removing the first passivation layer 1150 disposed on the drain electrode 1134 in the display area PA through a mask process using a photoresist pattern. The first passivation layer 1150 may be removed through a dry etching process.

Figure 10E:
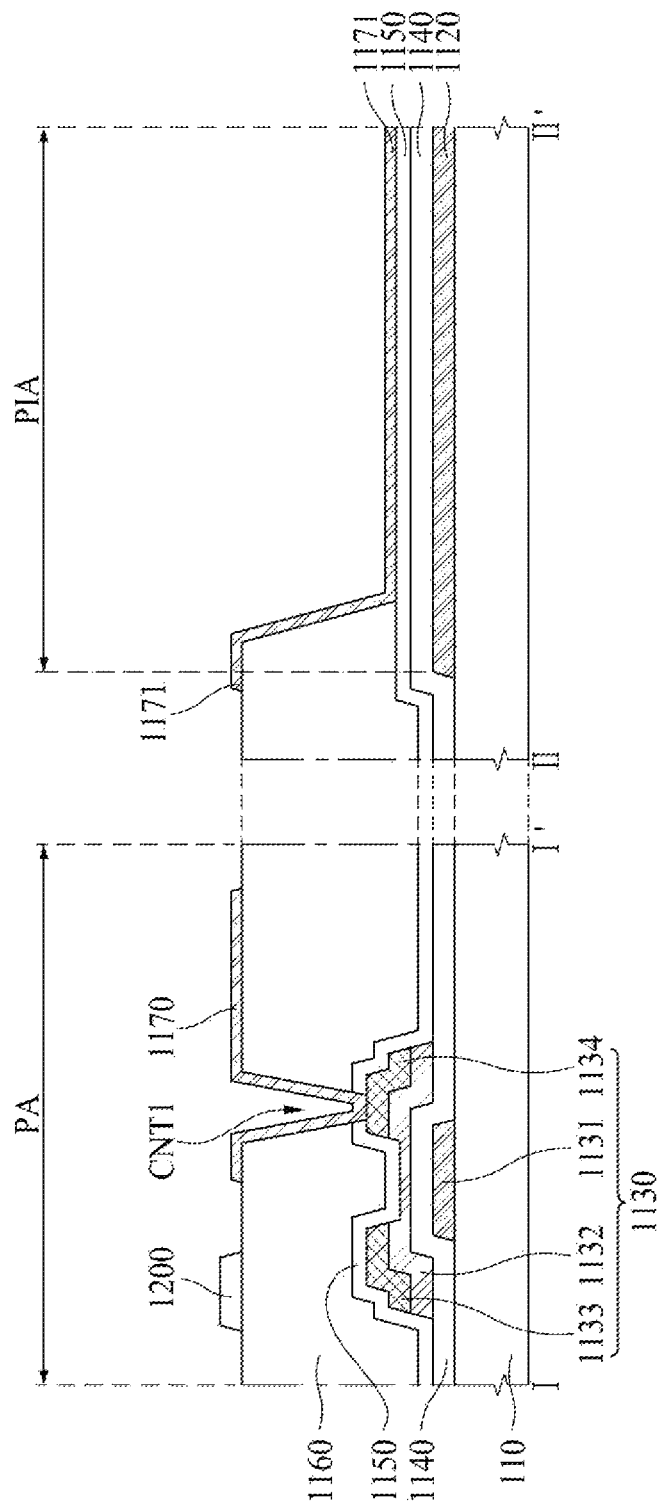

Fifth, as shown in FIG. 10E, a pixel electrode 1170 and an etch stop layer 1171 may be formed on the planarization layer 1160. (S105 of FIG. 9.) Here, a third metal layer may be formed on a whole upper surface of the planarization layer 1160 through a sputtering process or an MOCVD process. Subsequently, the pixel electrode 1170 and the etch stop layer 1171 may be formed by patterning the third metal layer through a mask process using a photoresist pattern. That is, the pixel electrode 1170 and the etch stop layer 1171 may be formed of the same material on the same layer. The pixel electrode 1170 and the etch stop layer 1171 may be formed of TCO, such as ITO or IZO capable of transmitting light.

The pixel electrode 1170 may be formed to contact the drain electrode 1134 through the first contact hole CNT1. The etch stop layer 1171 may be formed on the planarization layer 1160 and the first passivation layer 1150 in the panel ID area PIA. The etch stop layer 1171 may be formed on the planarization layer 1160 near the panel ID area PIA.

After the pixel electrode 1170 and the etch stop layer 1171 are formed, a common line 1200 may be formed on the planarization layer 1160. The common line 1200 may be formed on the same layer as the pixel electrode 1170 and the etch stop layer 1171. The common line 1200 may be formed of a material which differs from that of each of the pixel electrode 1170 and the etch stop layer 1171, for lowering a resistance. For example, the common line 1200 may be formed of one of Mo, Ti, Al, Cu, and Cr, or an alloy thereof.

Figure 10F:
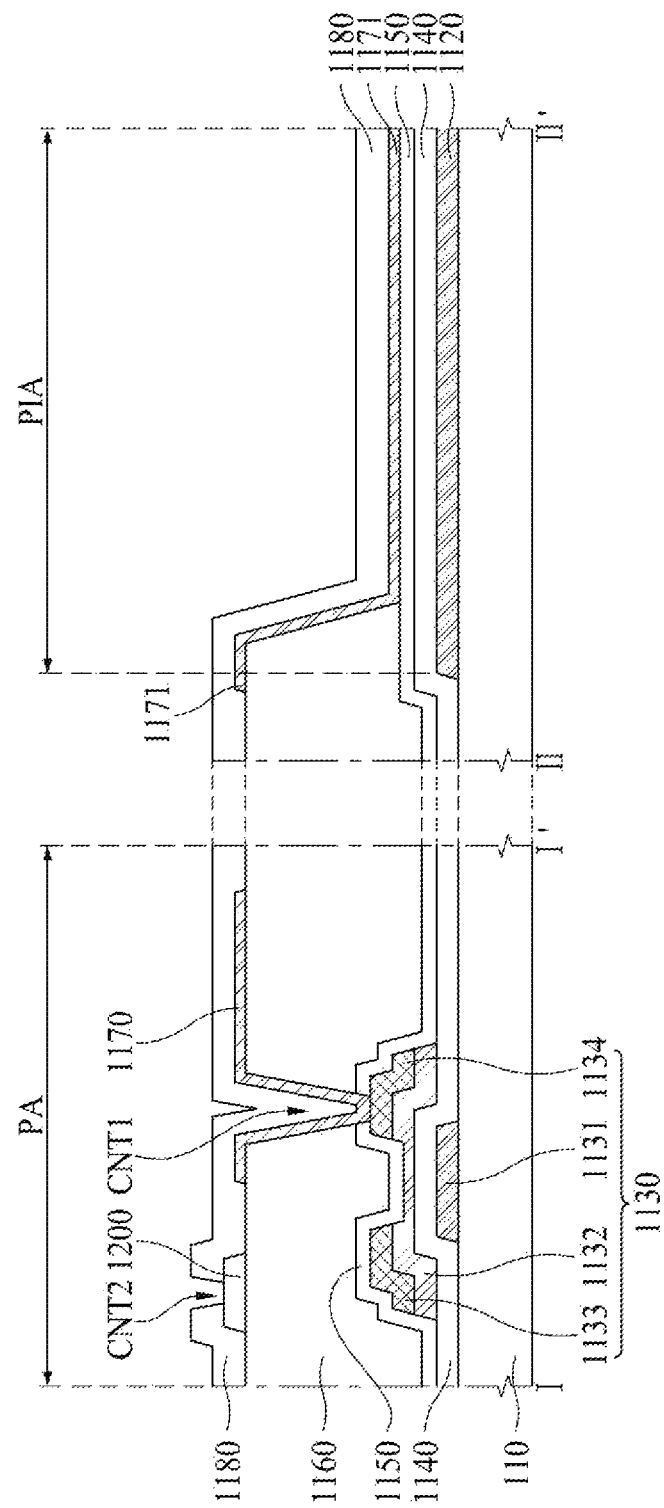

Sixth, as shown in FIG. 10F, a second passivation layer 1180 may be formed on the pixel electrode 1170 and the etch stop layer 1171. (S106 of FIG. 9.) The second passivation layer 1180 may be formed of a single layer including $SiO_2$ or SiNx, or may be formed of a complex layer including $SiO_2$ and SiNx.

Figure 10G:
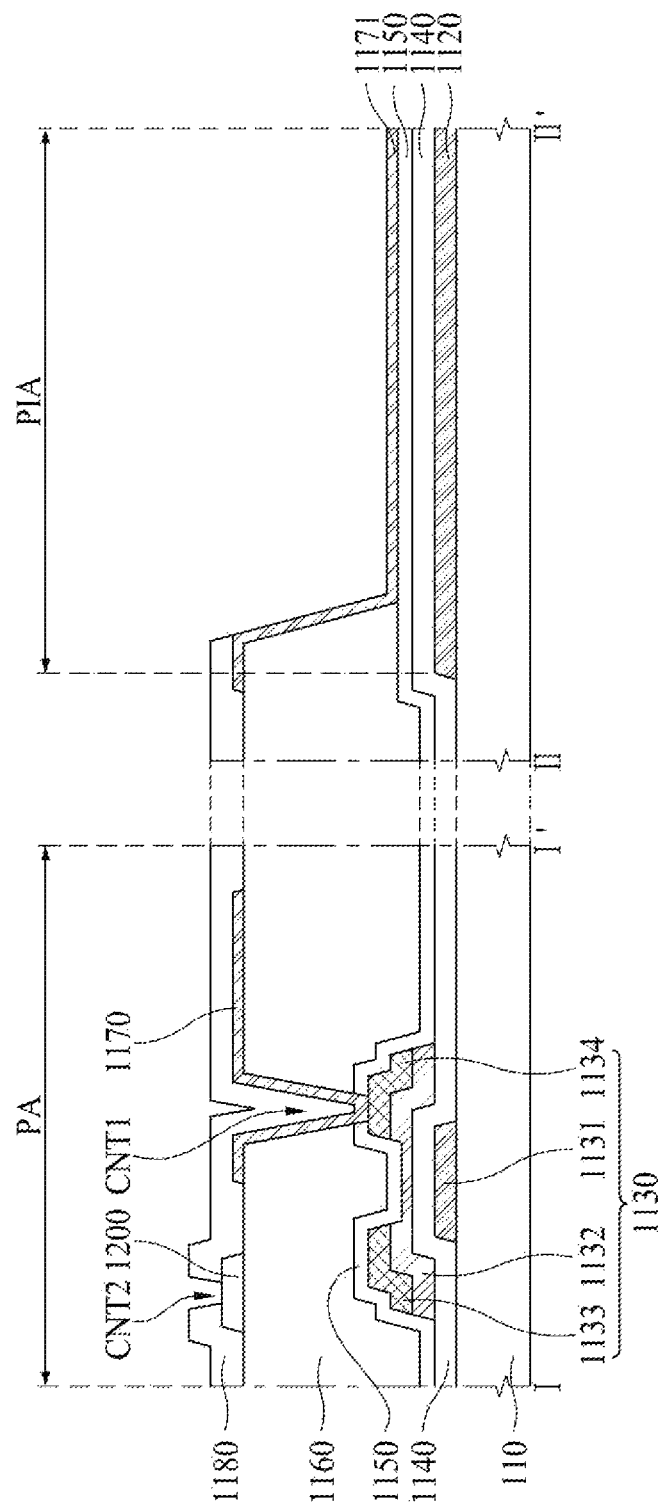

Seventh, as shown in FIG. 10G, the second passivation layer 1180 disposed in the panel ID layer PIA may be removed. (S107 of FIG. 9). Here, the second passivation layer 1180 disposed in the panel ID layer PIA may be removed through a mask process using a photoresist pattern. For example, the photoresist pattern may be formed on the second passivation layer 1180 in an area except for the panel ID area PIA, and the second passivation layer 1180 uncovered by the photoresist pattern may be removed through a dry etching process.

Figure 10H:
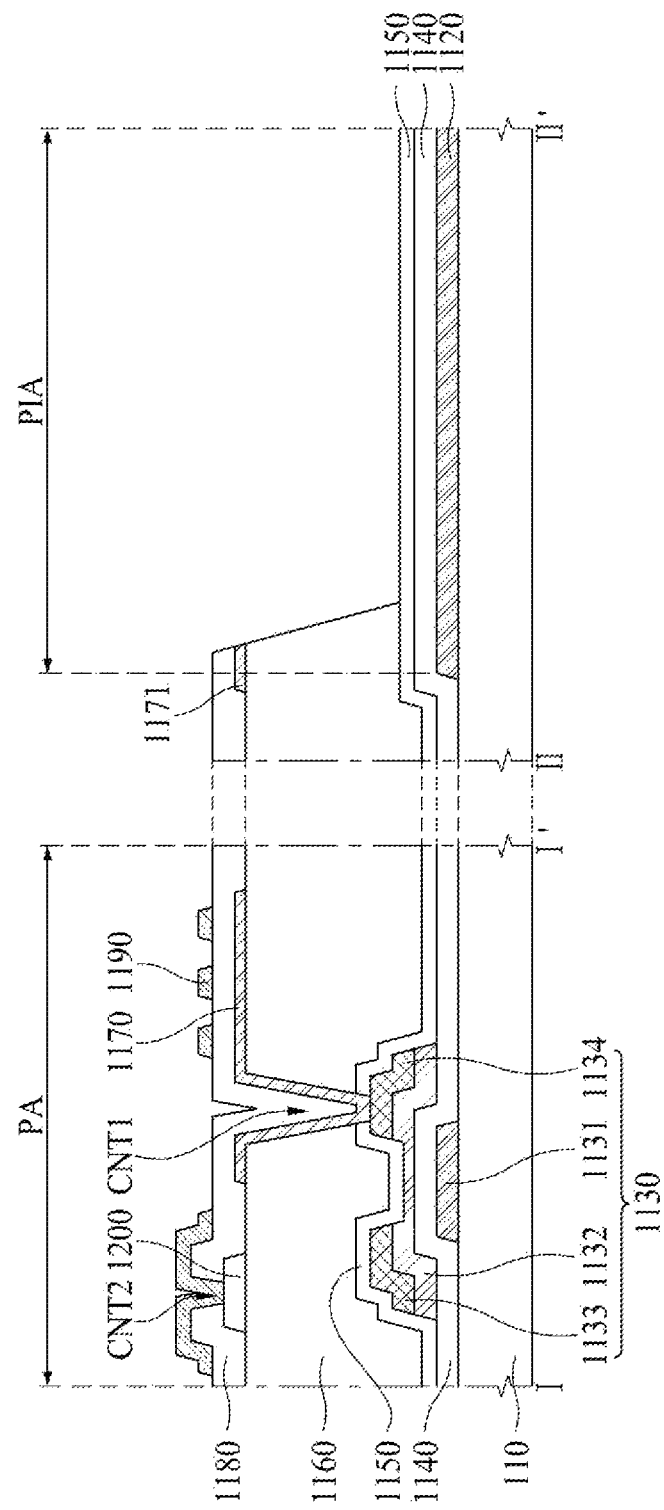

Eighth, as shown in FIG. 10H, a common electrode 1190 may be formed on the second passivation layer 1180, and the etch stop layer 1171 disposed in the panel ID area PIA may be removed. (S108 of FIG. 9.) Here, a fourth metal layer may be formed on a whole upper surface of the second passivation layer 1180 through a sputtering process or an MOCVD process. Subsequently, the common electrode 1190 may be formed by patterning the fourth metal layer through a mask process using a photoresist pattern.

Moreover, the etch stop layer 1171 in the panel ID area PIA may be removed simultaneously with patterning the common electrode 1190. Accordingly, a separate etching process is not needed for removing the etch stop layer 1171, thereby preventing the manufacturing cost from increasing.

Patterning of the common electrode 1190 and the etch stop layer 1171 in the panel ID area PIA may be performed through a wet etching process. In this case, a wet etchant may use an etchant which reacts with only the etch stop layer 1171 and the common electrode 1190 and does not react with the gate insulation layer 1140, the first passivation layer 1150, the planarization layer 1160, and the second passivation layer 1180. Therefore, the first passivation layer 1150 and the gate insulation layer 1140 may remain without being removed in the panel ID area PIA. Also, the etch stop layer 1171 covered by the second passivation layer 1180 may remain without being removed near the panel ID area PIA as well as in the panel ID area PIA.

The common electrode 1190 may contact the common line 1200 through a second contact CNT2 which passes through the second passivation layer 1180 to expose the common line 1200. The common electrode 1190 may be formed of TCO such as ITO or IZO capable of transmitting light.

Figure 10I:
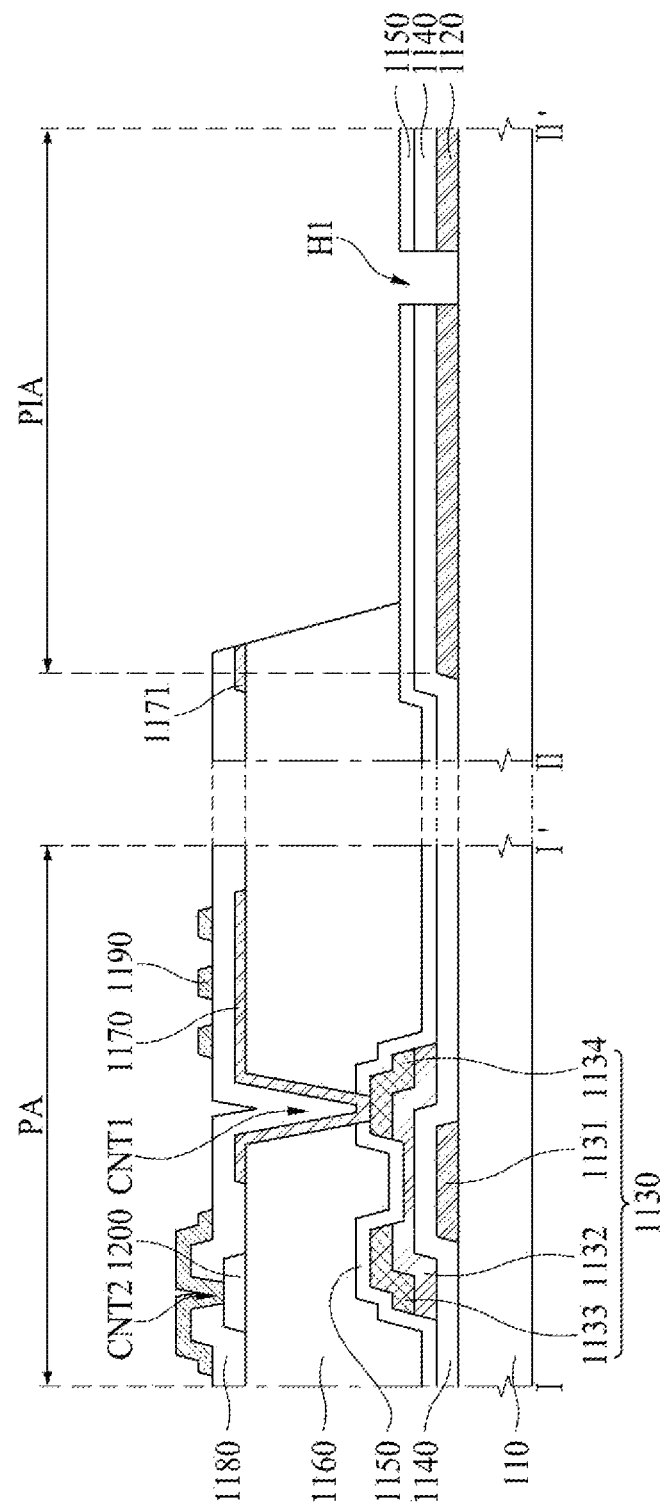

Ninth, as shown in FIG. 10I, a first hole H1 which passes through the first passivation layer 1150, the gate insulation layer 1140, and the panel ID layer 1120 in the panel ID area PIA may be formed using a laser. Accordingly, a panel ID PID may be formed on the panel ID layer 1120. (S109 of FIG. 9.)

According to the embodiments of the present disclosure, because the planarization layer and the second passivation layer are removed from the panel ID area, a thickness of the organic/inorganic layer is reduced. Accordingly, in an embodiment of the present disclosure, a recognition error occurring when recognizing the panel ID using the OCR may be reduced.

Moreover, according to the embodiments of the present disclosure, because a recognition error occurring when recognizing the panel ID using the OCR is reduced even without increasing an intensity of a laser, the passivation layer may be prevented from being stripped from the gate insulation layer.

Moreover, according to the embodiments of the present disclosure, the panel ID layer where the panel ID is provided is at least protected by the gate insulation layer, and thus, the panel ID layer is prevented from being damaged or corroded.

It will be apparent to those skilled in the art that various modifications and variations can be made in the display device and the method of manufacturing the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
    a substrate defining a display area having a plurality of pixels therein and a non-display area;
    a gate electrode in the display area;
    a panel identification layer in a panel identification area of the non-display area;
    a gate insulation layer on the gate electrode;
    a first passivation layer on the gate insulation layer;
    a planarization layer on the first passivation layer; and
    a second passivation layer on the planarization layer,
    wherein the second passivation layer and the planarization layer are absent in a portion of the panel identification area such that a portion of the first passivation layer is not covered by the second passivation layer and the planarization layer.

2. The display device of claim 1, wherein the gate electrode and the panel identification layer are on the same layer and include a same material.

3. The display device of claim 1, further comprising a first hole through the first passivation layer, and the gate insulation layer in the panel identification area.

4. The display device of claim 3, wherein the first hole further passes through the panel identification layer.

5. The display device of claim 4, wherein a portion of the substrate corresponding to the first hole is removed.

6. The display device of claim 1, further comprising:
    a pixel electrode between the planarization layer and the second passivation layer; and
    a common electrode on the second passivation layer.

7. The display device of claim 6, further comprising an etch stop layer on the planarization layer near the panel identification area.

8. The display device of claim 7, wherein the pixel electrode and the etch stop layer are on the same layer and include a same material.

9. The display device of claim 7, wherein the second passivation layer is on the pixel electrode and the etch stop layer.

10. The display device of claim 1, wherein the second passivation layer is on an inclined surface of the planarization layer in the panel identification area.

11. The display device of claim 10, further comprising an etch stop layer between the second passivation layer and the inclined surface of the planarization layer in the panel identification area.

12. A method of manufacturing a display device, comprising:
    forming a gate electrode on a substrate in a display area including a plurality of pixels, and a panel identification layer on the substrate in a panel identification area of a non-display area;
    forming a gate insulation layer on the gate electrode;
    forming a first passivation layer on the gate insulation layer;
    forming a planarization layer on the first passivation layer and removing the planarization layer in the panel identification area;
    forming a pixel electrode on the planarization layer in the display area and forming an etch stop layer on the first passivation layer and the planarization layer in the panel identification area;
    forming a second passivation layer on the pixel electrode and the etch stop layer;
    removing a portion of the second passivation layer at a portion of the panel identification area; and
    forming a common electrode on the second passivation layer and removing the etch stop layer.

13. The method of claim 12, wherein the forming of the gate electrode and the panel identification layer includes simultaneously forming the gate electrode and the panel identification layer on the substrate using a same material.

14. The method of claim 12, wherein the forming of the pixel electrode and the etch stop layer includes simultaneously forming the pixel electrode and the etch stop layer using a same material.

15. The method of claim 12, wherein in the removing of the second passivation layer, the etch stop layer in a portion near the panel identification area remains.

16. The method of claim 12, wherein the forming of the common electrode and the removing of the etch stop layer comprise:
    forming a common metal layer on the second passivation layer; and
    etching the common metal layer through a wet etching process to pattern the common electrode, and simultaneously, etching the etch stop layer.

17. The method of claim 12, further comprising forming a first hole by removing at least a portion of the panel identification layer in the panel identification area with a laser, wherein the first hole passes through the first passivation layer and the gate insulation layer.

18. The method of claim 17, wherein the first hole passes through the panel identification layer.

19. The method of claim 18, wherein a portion of the substrate corresponding to the first hole is removed.

* * * * *